United States Patent Office 3,575,867
Patented Apr. 20, 1971

3,575,867

NOVEL SOLVENT MIXTURES

Raymond A. Nesbitt, Morristown, and Francis J. Figiel, Boonton, N.J., assignors to Allied Chemical Corporation, New York, N.Y.

No Drawing. Filed Feb. 6, 1969, Ser. No. 797,245
Int. Cl. C09d 9/00; C11d 7/50; C23g 5/02
U.S. Cl. 252—171 13 Claims

ABSTRACT OF THE DISCLOSURE

Certain mixtures of tetrachlorodifluoroethane and acetonitrile are useful as solvents to remove rosin fluxes from printed circuit boards. These mixtures are useful because of their unusually high solvency characteristics. A narrower class of such mixtures is particularly valuable because, in addition to high solvency characteristics, the mixtures exhibit azeotropic constant boiling characteristics, thereby facilitating handling and purification of the solvent mixtures without significantly altering their compositions.

BACKGROUND OF THE INVENTION

The electronic industry has sought for solvents which can efficiently remove rosin fluxes from printed circuit boards containing the same. The rosin fluxes are intentionally deposited on the surface of the circuit boards prior to soldering on electronic components, but must be removed after soldering in order to achieve maximum reliability of the printed circuits. The solvent must not only be highly effective for removing the undesired rosin flux but must, for commercial applications, be stable and inert toward the electronic components on the circuit board itself.

A variety of solvents have been tested for such purposes but generally have been found to be lacking, to a greater or lesser extent, one or more of the above-described properties. For example, whereas highly chlorinated solvents, such as $CH_2Cl_2$ and $CHCl_3$, are highly effective for the removal of rosin flux; such solvents, when used alone, attack the electronic components on the circuit board. Such solvents also require the addition of a stabilizer to prevent decomposition. Sym-tetrachlorodifluoroethane ($CCl_2FCCl_2F$) and asymtetrachlorodifluoroethane ($CClF_2CCl_3$) are examples of common solvents which are very stable and which accordingly would not cause any decomposition problems during use. Unfortunately, these reagents exhibit only limited solvencies for rosin fluxes commonly used on electronic assemblies. A variety of non-constant boiling solvent mixtures have been employed to achieve the desired solvency, while retaining the desired inertness toward the electronic components. Such previously known mixtures are not generally known to possess as high a degree of solvency toward rosin fluxes as might be desired. Moreover, preferential evaporation of the more volatile component of such mixtures results in mixtures with changed compositions which may have less desirable properties, such as lower solvency for rosin fluxes.

A number of binary azeotropic (constant boiling) mixtures have been employed for the purpose of cleaning electrical circuits, which afford many of the advantages obtainable with solvent mixtures, but which do not suffer from the above described disadvantage possessed by non-constant boiling solvent mixtures. Illustrative of such binary azeotropic systems are the azeotrope of 1,1,2-trichloro-1,2,2-trifluoroethane and methylene chloride, B.P. 37° C./760 mm. (U.S. Pat. 2,999,817) and the azeotrope of 1,1,2-trichloro-1,2,2-trifluoroethane and methyl alcohol, B.P. 39° C./760 mm. (U.S. Pat. 2,999,816). Unfortunately, the solvencies of these binary azeotropic compositions for the common rosin fluxes which are employed in the manufacture of printed circuit boards are such that the solvents either attack the boards or components, leave deposits on the boards or become cloudy after use.

It is a major object of this invention to provide novel solvent compositions for rosin fluxes normally encountered on printed circuit boards which novel solvent compositions exhibit a high degree of solvency for such rosin fluxes.

It is another object of this invention to provide novel solvent compositions for rosin fluxes of printed circuit boards which are constant boiling or essentially constant boiling.

Another object of the invention is to provide novel solvent compositions for rosin fluxes used on printed circuit boards which combine the properties of high solvency and inertness to electronic components.

It is a particular object of the invention to provide novel solvent mixtures possessing the stability characteristics of $CCl_2FCCl_2F$ and $CClF_2CCl_3$ but which exhibit significantly greater solvency properties toward rosin fluxes which are normally found on printed circuit boards.

Other objects and advantages of the invention will be apparent from the following description.

SUMMARY OF THE INVENTION

In accordance with the invention, it has been discovered that mixtures consisting essentially of tetrachlorodifluoroethane ($C_2Cl_4F_2$) and acetonitrile ($CH_2CN$) in which the weight percent of tetrachlorodifluoroethane is the range of about 70–95 exhibit unexpectedly high solvency for rosin fluxes commonly used on printed circuit boards.

Tetrachlorodifluoroethanes (sym-, $CCl_2FCCl_2F$ and asym-, $CClF_2CCl_3$) are commercially produced as mixtures of the two isomers. One commercial process resulting in such mixtures comprises reacting perchloroethylene with HF and chlorine in the presence of an antimony pentahalide catalyst at temperatures in the range of about 100–300° F., followed by distillation. The sym-isomer boils at 92.5° C. The asym-isomer boils at 91.0° C. The boiling points of the commercial mixtures are intermediate these limits. Since the difference in boiling points of the two isomers is so small, minor composition changes are of no practical importance and there is no compelling reason to separate the isomers. If desired, however, separation could be effectively achieved by conventional fractional crystallization procedures.

High purity asym-tetrachlorodifluoroethane can be produced free of its sym-isomer by reacting $CH_3CHF_2$ with $Cl_2$ at 400–600° C. followed by simple distillation.

For the purpose of this discussion, the term "tetrachlorodifluoroethane" or "$C_2Cl_4F_2$" will be used in the specification and in the claims to denote sym-tetrachlorodifluoroethane, asym-tetrachlorodifluoroethane, or mixtures thereof in any proportions.

Compositions as defined within the 70–95 weight percent $C_2Cl_4F_2$ range will dissolve some contaminants which are not soluble in either $C_2Cl_4F_2$ or $CH_3CN$ alone.

Compositions of $C_2Cl_4F_2$ and $CH_3CN$ within the indicated weight percent range will remain clear even after repeated use to dissolve rosin fluxes, whereas when either $C_2Cl_4F_2$ or $CH_3CN$ are used alone, precipitation of the rosin fluxes in the solvents takes place quickly, causing such solvents to become cloudy. Continued use of the solvents in such a state results in redeposition of rosin fluxes on the circuit boards after removal of the solvents.

Further, compositions within the 70–95 weight percent range are inert to electrical components used on printed circuit boards.

It has been further found that azeotropic mixtures are formed at approximately 77 weight percent $C_2Cl_4F_2$ and 23 weight percent $CH_3CN$ (B.P. 71.5° C./760 mm.) and that these mixtures as well as certain equivalent mixtures in which the weight percent of $C_2Cl_4F_2$ lies between about 75–85 weight percent, are constant boiling or essentially constant boiling. Such mixtures accordingly exhibit little or no change in composition on partial or complete evaporation such as would occur in normal handling or in usual reclamation procedures.

A preferred class of compositions within the scope of the invention are those in which the weight percent of the $C_2Cl_4F_2$ component lies between about 75–80. Such compositions are closest to the true azeotropes in constant boiling characteristics and are not subject to discernible composition change upon partial or complete evaporation or distillation. Still more preferred are the true azeotropic compositions composed of about 77 weight percent $C_2Cl_4F_2$. When pure $CCl_2FCCL_2F$ is used with $CH_3CN$, the true azetrope mixture comprises a binary mixture of $CCl_2FCCl_2F$ and $CH_3CN$. When pure $CClF_2CCl_3$ is used with $CH_3CN$ the true azeotrope comprises a binary mixture of $CClF_2CCl_3$ and $CH_3CN$. When a $CCl_2FCCl_2F$/$CClF_2CCl_3$ mixture is used with $CH_3CN$, the "true azeotrope" is actually a mixture of the above-indicated true binary azeotropes.

None of the mixtures within the scope of the invention have any adverse effects upon circuit boards themselves or upon the electronic components affixed thereto.

The novel mixtures of the invention may be purified and reclaimed for use after they have ultimately become saturated by simple flash distillation.

DETAILED DESCRIPTION AND DISCUSSION

Example 1

A sample of about equimolar amounts of $CH_3CN$, B.P. 82° C., and $C_2Cl_4F_2$ (a commercial mixture of about 70 weight percent $CCl_2FCCl_2F$ and about 30 weight percent $CClF_2CCl_3$, B.P. 91–92.5° C./760 mm.) is refluxed in a 2,000 ml. pot of a 4′ (length) x ½″ (diameter) laboratory still. The temperature at the still head is 71.5° C./760.7 mm. This temperature is below the boiling points of either of the mixture components, thereby indicating that an azeotropic system is formed. A sample of the azeotrope distillate is analyzed by liquid-gas chromatography and the presence of $CH_3CN$, $CCl_2FCCl_2F$ and $CClF_2CCl_3$ is confirmed. The azeotrope is then redistilled but no change in boiling point or composition is indicated. The composition is then determined by calibration of the chromatograms and is found to be:

| | Weight percent |
|---|---|
| $C_2Cl_4F_2$ | 76.8 |
| $CH_3CN$ | 23.2 |

Example 2

Example 1 is repeated except that pure $CCl_2FCCl_2F$ is used in place of the $C_2Cl_4F_2$ mixture. A constant boiling binary azeotrope of $CCl_2FCCl_2F$ and $CH_3CN$ is formed.

Example 3

Example 1 is repeated except that pure $CClF_2CCl_3$ is used in place of the $C_2Cl_4F_2$ mixture. A constant boiling binary azetrope of $CClF_2CCl_3$ and $CH_3CN$ is formed.

Example 4

The solvency powers of certain mixtures of $C_2Cl_4F_2$ and $CH_3CN$ were evaluated by determining their Kauri-Butanol values (K-B values) in accordance with ASTM test D1133–61. In all cases the $C_2Cl_4F_2$ component was a commercial mixture of about 70 weight percent $CCl_2FCCl_2F$ and about 30 weight percent $CClF_2CCl_3$. The results of the evaluations are noted in the following table:

TABLE I

| Solvent | K-B value |
|---|---|
| $C_2Cl_4F_2$ | 68.4 |
| $CH_3CN$ | 16.9 |
| 76.8 weight percent $C_2Cl_4F_2$; 23.8 weight percent $CH_3CN$, azeotrope | 110.6 |
| 90.0 weight percent $C_2Cl_4F_2$; 10.0 weight percent $CH_3CN$ | [1] 104 |
| 83.2 weight percent $C_2Cl_4F_2$; 16.8 weight percent $CH_3CN$ | 100.6 |
| 68.8 weight percent $C_2Cl_4F_2$; 31.2 weight percent $CH_3CN$ | 58.4 |
| 70.0 weight percent $C_2Cl_4F_2$; 30.0 weight percent $CH_3CN$ | [1] 70 |
| 95.0 weight percent $C_2Cl_4F_2$; 5.0 weight percent $CH_3CN$ | [1] 77.8 |
| 75.0 weight percent $C_2Cl_4F_2$; 25.0 weight percent $CH_3CN$ | [1] 102.4 |
| 85.0 weight percent $C_2Cl_4F_2$; 15.0 wieght percent $CH_3CN$ | [1] 96.8 |
| 80.0 weight percent $C_2Cl_4F_2$; 20.0 weight percent $CH_3CN$ | [1] 105.0 |

[1] Determined by interpolation.

The above data show that the K-B values of all the above noted mixtures within the scope of the invention are higher than the K-B value of either of the mixture components alone. This shows that the solvency powers of such mixtures are greater than those of the mixture components alone.

Example 5

The unexpectedly high solvency power of the novel $C_2Cl_4F_2/CH_3CN$ mixtures is further shown by the following data:

A number of test strips (2 x ½ cm.) were cut from standard epoxy printed circuit boards and then coated with two common varieties of rosin fluxes. The coated strips were baked in an oven at 400° F. for 20 seconds and then again at 480° F. for 20 seconds. Some of the strips were then completely immersed in a sample of the constant boiling $C_2Cl_4F_2/CH_3CN$ mixture produced according to Example 1. Others of the strips were immersed in $CH_3CN$ alone and still others of the strips were immersed in $C_2Cl_4F_2$ (70 weight percent $CCl_2FCCl_2F$/30 weight percent $CClF_2CCl_3$ mixture) alone. After 60 seconds immersion in each of the solvents at 65° C., with ultrasonic vibration, the strips were removed from the solvents. The results of the tests were noted in the following table:

APPEARANCE OF STRIPS ROSIN FLUX

| Solvent | No flux | "Alpha" 611 [1] | "London" 77-25-TA [2] |
|---|---|---|---|
| $CH_3CN$ | Dull but clean | Flux blistered | Clean, some white deposits. |
| | do | do | Do. |
| $C_2Cl_4F_2$ | do | Uneven dullness | Some spot corrosion. |
| | do | do | Heavy corrosion in one area. |
| $C_2Cl_4F_2/CH_3CN$ | Bright and shiny | Bright and shiny | Bright and shiny. |
| | do | do | Do. |

[1] "Alpha" is a trademark of Alpha Metals, Inc.
[2] "London" is a trademark of London Chemical Co., Inc.

Both of these rosin fluxes are commonly used in the manufacture of printed circuits and are said to contain as major ingredients some form of pine tree gum, abietic acid and related substances.

It was observed that each of the used $C_2Cl_4F_2$ and $CH_3CN$ solvent solutions had turned cloudy. Furthermore, rosin flux agglomerated in the acetonitrile solvent solution upon standing. On the other hand, the used $C_2Cl_4F_2/CH_3CN$ azeotropic solvent solution was clear and remained so even after standing. The above is evidentiary of the unexpectedly high solvency power of the novel azeotropic composition and equivalents.

The novel solvent mixtures of the invention find other solvent applications such as for removing greases and oils from a variety of industrial items, for the removal of soldering fluxes, for the cleaning of photographic films and prints, for the removal of buffing compounds such as rouge and also may be used as heat exchange media, electrical transfer media, chemical reaction media, hydraulic fluids and as media for a controlled solvation of acrylonitrile-butadiene styrene type resins.

It will be apparent to those skilled in the art that for specialized purposes, various additives could be incorporated with the novel solvent mixtures of the invention, for example, lubricants, detergents and the like. These additives are chosen so as not to adversely affect the essential properties of the mixtures for a given application.

The invention is not intended to be limited by any specific embodiments disclosed herein, but only by the scope of the following claims.

We claim:

1. Mixtures consisting essentially of tetrachlorodifluoroethane and acetonitrile in which the weight percent of tetrachlorodifluoroethane is in the range of about 70 to 95.

2. Mixtures according to claim 1 in which the weight percent of tetrachlorodifluoroethane is in the range of about 75–85.

3. Mixtures according to claim 1 in which the weight percent of tetrachlorodifluoroethane is in the range of about 75–80.

4. Mixtures according to claim 1 in which the weight percent of tetrachlorodifluoroethane is about 77.

5. Mixtures according to claim 1 in which the tetrachlorodifluoroethane component is $CCl_2FCCl_2F$.

6. Mixtures according to claim 5 in which the weight percent of $CCl_2FCCl_2F$ is in the range of about 75–85.

7. Mixtures according to claim 5 in which the weight percent of $CCl_2FCCl_2F$ is about 77.

8. Mixtures according to claim 1 in which the tetrachlorodifluoroethane component is $CClF_2CCl_3$.

9. Mixtures according to claim 8 in which the weight percent of $CClF_2CCl_3$ is in the range of about 75–85.

10. Mixtures according to claim 8 in which the weight percent of $CClF_2CCl_3$ is about 77.

11. Mixtures according to claim 1 in which the tetrachlorodifluoroethane is a mixture of $CCl_2FCCl_2F$ and $CClF_2CCl_3$.

12. Mixtures according to claim 11 in which the weight percent of tetrachlorodifluoroethane is in the range of 75–85.

13. Mixtures according to claim 11 in which the weight percent of tetrachlorodifluoroethane is about 77.

References Cited

UNITED STATES PATENTS

| | | | |
|---|---|---|---|
| 3,183,192 | 5/1965 | Bauer | 252—67 |
| 3,505,415 | 4/1970 | Richtzenhain et al. | 260—652.5 |

LEON D. ROSDOL, Primary Examiner

W. E. SCHULZ, Assistant Examiner

U.S. Cl. X.R.

252—67, 73; 260—652.5